United States Patent
Huang et al.

(10) Patent No.: US 6,197,698 B1
(45) Date of Patent: Mar. 6, 2001

(54) METHOD FOR ETCHING A POLY-SILICON LAYER OF A SEMICONDUCTOR WAFER

(75) Inventors: Jui-Tsen Huang, Taipei; Kuang-Hua Shih, Hsin-Chu; Tsu-An Lin, Hsin-Chu Hsien; Chan-Lon Yang, Taipei, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/340,400

(22) Filed: Jun. 28, 1999

(51) Int. Cl.$^7$ ................................. H01L 21/3065
(52) U.S. Cl. ............... 438/706; 438/710; 438/712; 438/714; 438/715
(58) Field of Search ........................ 438/706, 710, 438/712, 714, 719, 720, 396; 156/643.1, 345

(56) References Cited

U.S. PATENT DOCUMENTS 4,950,618 * 8/1990 Sundaresan et al. ............. 438/517
5,468,342 * 11/1995 Nulty et al. ...................... 156/643.1
5,627,395 * 5/1997 Witek et al. ...................... 257/350
5,656,533 * 8/1997 Kim .................................. 438/396

* cited by examiner

Primary Examiner—Benjamin L. Utech
Assistant Examiner—Lan Vinh
(74) Attorney, Agent, or Firm—Winston Hsu

(57) ABSTRACT

The present invention provides a method for etching a poly-silicon layer of a semiconductor wafer. The semiconductor wafer comprises a dielectric layer, a poly-silicon layer situated on the dielectric layer and containing dopants to a predetermined depth, and a photo-resist layer having a rectangular cross-section above a predetermined area of the poly-silicon layer. The semiconductor wafer is processed in a plasma chamber. A first dry-etching process is performed to vertically etch away the dopant-containing portion of the poly-silicon layer not covered by the photo-resist layer. Then, a second dry-etching process is performed to vertically etch away the residual portion of the poly-silicon layer not covered by the photo-resist layer down to the surface of the dielectric layer. The etching gases used in the first dry-etching process differ from those used in the second dry-etching process, and the main etching gas of the first dry-etching process is $C_2F_6$.

6 Claims, 4 Drawing Sheets

METHOD FOR ETCHING A POLY-SILICON LAYER OF A SEMICONDUCTOR WAFER

BACKGROUND OF THE INVENTION

1. Field of the Invention

The present invention relates to a method for etching a poly-silicon layer, and more particularly, to a method for etching a poly-silicon layer of a gate.

2. Description of the Prior Art

In semiconductor processing, the main component of the gate of the metal-oxide-semiconductor (MOS) transistor is the poly-silicon layer. After photolithography and etching are performed on the poly-silicon layer, the pattern of the gate is defined on a dielectric layer of a semiconductor wafer. In semiconductor processing with gate lengths of less than 0.18 um, ion implantation, photolithography, etching, and heat treatment are performed sequentially on the poly-silicon layer to adjust the threshold voltage of the MOS transistor. Problems arise during the etching process if the dopant-containing portion of the poly-silicon layer becomes over etched resulting in varying shapes of each gate. This lowers the reliability of semiconductor products.

Please refer to FIG. 1 to FIG. 3. FIG. 1 to FIG. 3 are schematic diagrams of the method for forming the gates 26, 28 by using the method for etching the poly-silicon layer 14 according to the prior art. As shown in FIG. 1, the method for forming the gates 26, 28 of the MOS transistor is employed in semiconductor processing with gate lengths equal to 0.18 um. First, a dielectric layer 12 and a poly-silicon layer 14 to be used as the electrode of the gate are sequentially formed on a semiconductor wafer 10. Then, an ion implantation process is performed in a predetermined area of the poly-silicon layer 14 to implant dopants to a predetermined depth thus forming the ion implantation layer 18. Next, an anti-reflection bottom layer 22 is formed on the poly-silicon layer 14 to decrease reflection on the surface of the semiconductor wafer 10 such that the accuracy of gate pattern transfer is not diminished. Next, a photolithography process is performed to form a plurality of photo-resist layers 24 with rectangular cross-sections in the predetermined area of the anti-reflection bottom layer 22 for defining the pattern of the gate.

As shown in FIG. 2, the next step involves removing the anti-reflection bottom layer 22 not covered by the photo-resist layers 24. Then, an etching process is performed to vertically etch away the poly-silicon layer 14 and the ion implantation layer 18 not covered by the photo-resist layer 24. As shown in FIG. 3, the photo-resist layer 24 is then removed thus forming the anti-reflection bottom layer 22 and the poly-silicon layer 16 in the predetermined area as a plurality of gates 26, 28 with rectangular cross-sections.

In the method for etching the poly-silicon layer 14 according to the prior art, a combination of $Cl_2$, HBr, He and $O_2$ is used as the etching gas. However, use of this gas combination causes the etching rate on the sidewall of the poly-silicon layer 16 to differ greatly from that on the sidewall of the ion implantation layer 18 where over etching may occur. This causes this layer to become sunken. Therefore, the sidewall of the gate 26 comprising the ion implantation layer 18 is not as vertical as the sidewall of the gate 28 without the ion implantation layer 18, as shown in FIG. 3. The different profiles of the gates 26, 28 lower the reliability of semiconductor products.

SUMMARY OF THE INVENTION

It is therefore a primary objective of the present invention to provide a method for etching the poly-silicon layer to form the gates with the same profiles so as to enhance the reliability of semiconductor products.

In a preferred embodiment, the present invention provides a method for etching a poly-silicon layer of a semiconductor wafer, the semiconductor wafer comprising a dielectric layer, a poly-silicon layer situated on the dielectric layer and containing dopants to a predetermined depth, and a photo-resist layer having a rectangular cross-section above a predetermined area of the poly-silicon layer, the semiconductor wafer being processed in a plasma chamber, the method comprising:

performing a first dry-etching process to vertically etch away the dopant-containing portion of the poly-silicon layer not covered by the photo-resist layer; and performing a second dry-etching process to vertically etch away the residual portion of the poly-silicon layer not covered by the photo-resist layer down to the surface of the dielectric layer;

wherein the etching gases used in the first dry-etching process differ from those used in the second dry-etching process, and the main etching gas of the first dry-etching process is $C_2F_6$.

It is an advantage of the present invention that $C_2H_6$ is employed as the main etching gas in the first dry-etching process to etch away the dopant-containing portion of the poly-silicon layer so as to prevent the gate from becoming sunken. Next, the second dry-etching process can be performed to remove the residual poly-silicon layer not covered by the photo-resist layer. Therefore, the sidewalls of the gates are vertical profiles and thus the reliability of semiconductor products is increased.

This and other objective of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
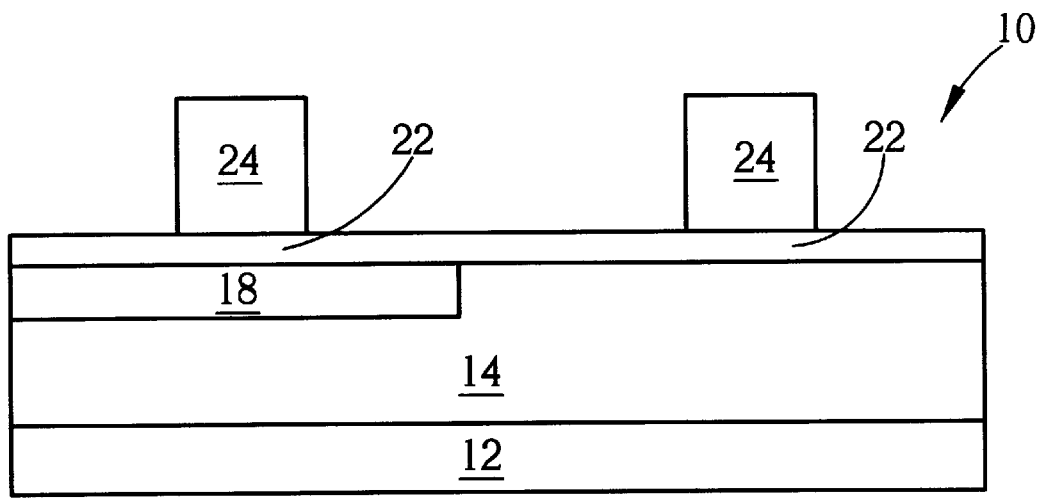
FIG. 1, FIG. 2 and FIG. 3 are schematic diagrams of the method for forming gates by using the method for etching the poly-silicon layer according to the prior art.
Figure 2:
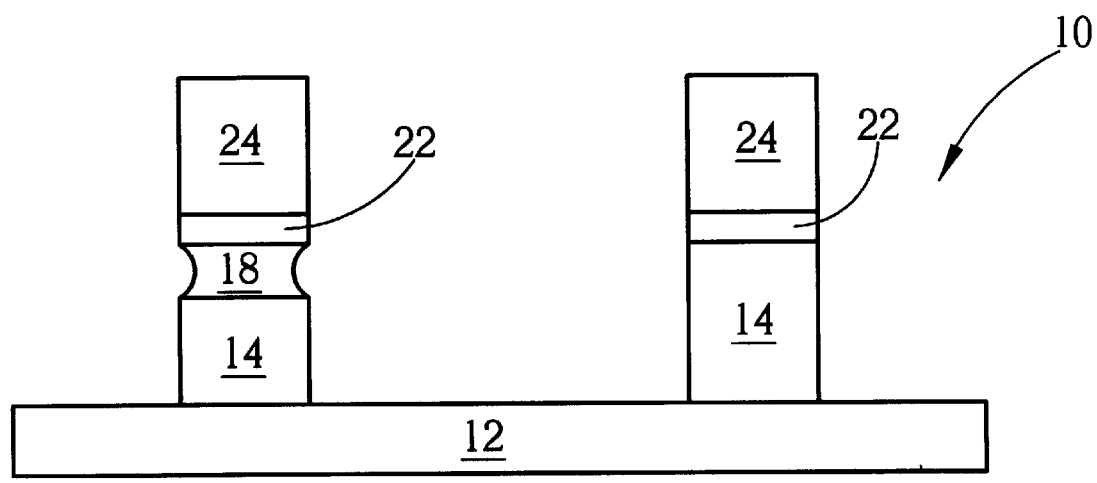
Figure 3:
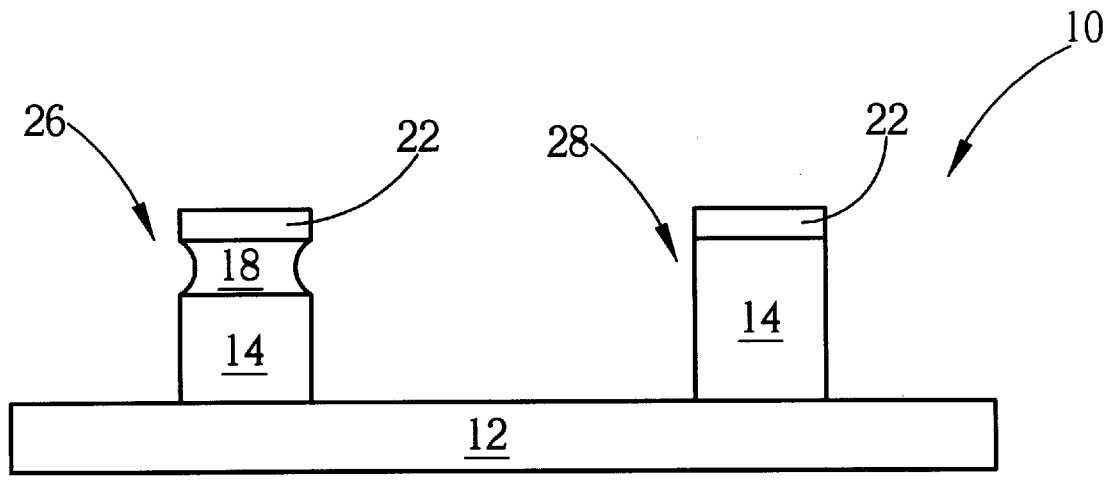
Figure 4:
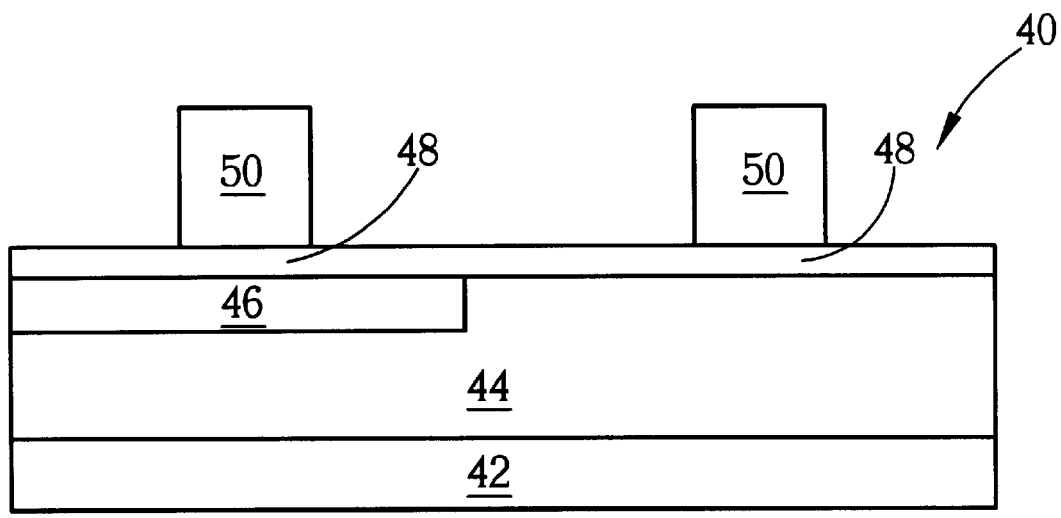
FIG. 4, FIG. 5, FIG. 6, FIG. 7 and FIG. 8 are schematic diagrams of the method for forming gates by using the method for etching the poly-silicon layer according to the present invention.
Figure 5:
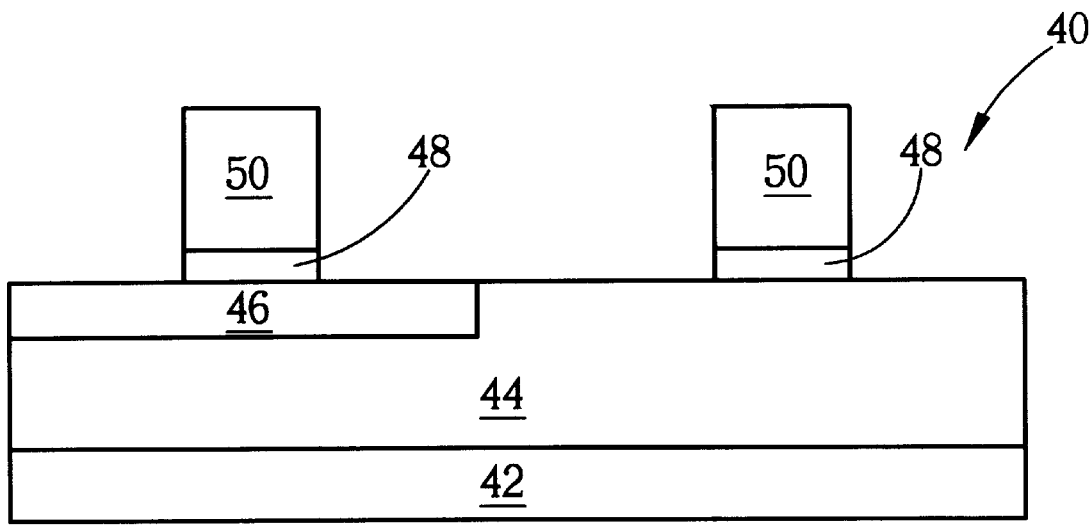

Please refer to FIG. 4 to FIG. 8. FIG. 4 to FIG. 8 are schematic diagrams of the method for forming gates 56, 58 by using the method for etching the poly-silicon layer 44 according to the present invention. A method for etching a poly-silicon layer 44 of a semiconductor wafer 40 is utilized in the semiconductor process with gate lengths less than 0.18 um to form the gates 56, 58 of the MOS transistor. First, the pattern of gate is defined on the semiconductor wafer 40 by using photolithography. As shown in FIG. 4, the semiconductor wafer 40 comprises a dielectric layer 42 formed of silicon dioxide, an ion implantation layer 46, a poly-silicon layer 44, an anti-reflection bottom layer 48 and a plurality of photo-resist layers 50 with rectangular cross-sections. The poly-silicon layer 44 is situated on the dielectric layer 42. The ion implantation layer 46 is formed in a predetermined area on the poly-silicon layer 44 by performing an ion implantation process and is the dopant-containing portion of the poly-silicon layer 44. The dopants penetrate to a predetermined depth so as to adjust the threshold voltage of the MOS transistor. The anti-reflection layer 48 is positioned on the poly-silicon layer 44 and decreases reflection on the semiconductor wafer 40. The photo-resist layer 50 is positioned on a plurality of predetermined areas of the anti-reflection layer 48. Then, a bottom dry-etching process is performed to vertically remove the anti-reflection layer 48 not covered by the photo-resist layer 50 down to the poly-silicon layer 44, as shown in FIG. 4.

Figure 6:
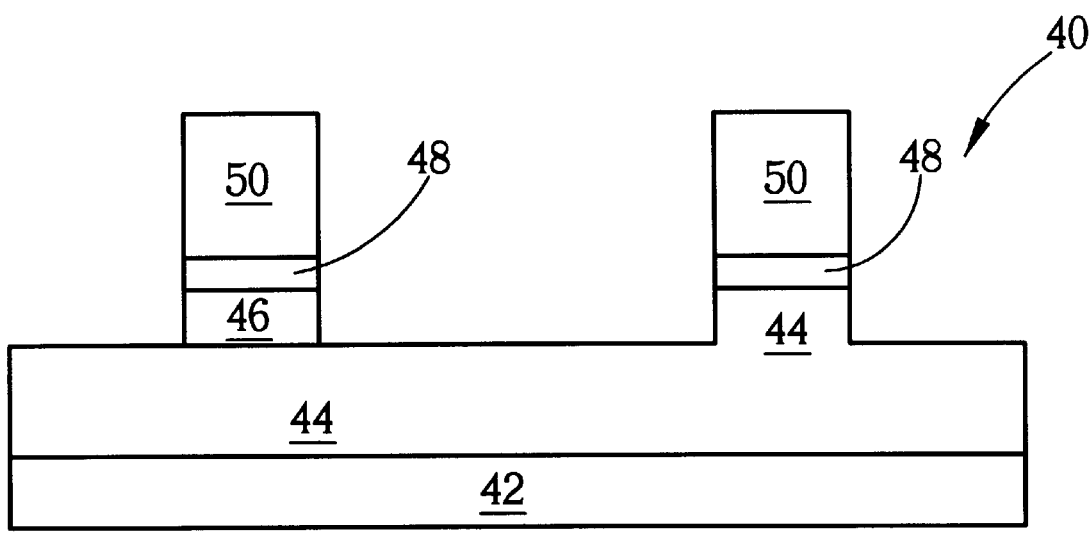

Next, the semiconductor wafer 40 is processed in a plasma chamber (not shown) for etching the poly-silicon layer 44 in the plasma environment. A first dry-etching process is performed to vertically etch away the ion implantation layer 46 not covered by the photo-resist layer 50. At the same time, the poly-silicon layer 44 not covered by the photo-resist layer 50 is also removed to the same depth, as shown in FIG. 6.

The etching gases of the first dry-etching process comprises $C_2F_6$, He and $O_2$, wherein $C_2F_6$ is the main etching gas whose flow rate is 70 to 150 sccm. The plasma chamber is operated at a chamber pressure of 10 to 20 mTorr, a top-electrode and bottom-electrode power of 200 to 300 W and 50 to 100 W, respectively, a chamber wall temperature of 50 to 70° C. and an electro-static chuck temperature of 65 to 75° C. The electro-static chuck is used to load the semiconductor wafer 40 in the plasma chamber.

Figure 7:
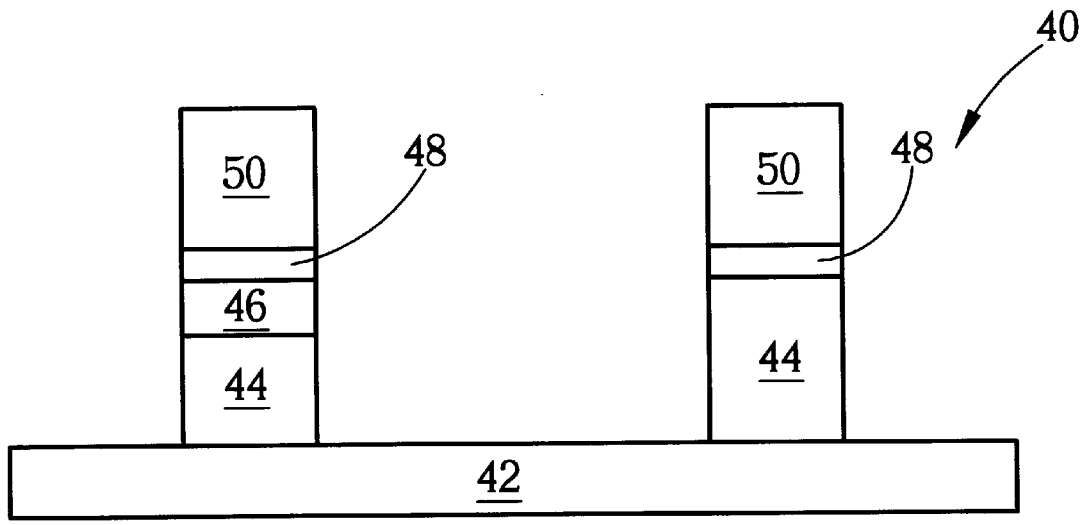
Figure 8:
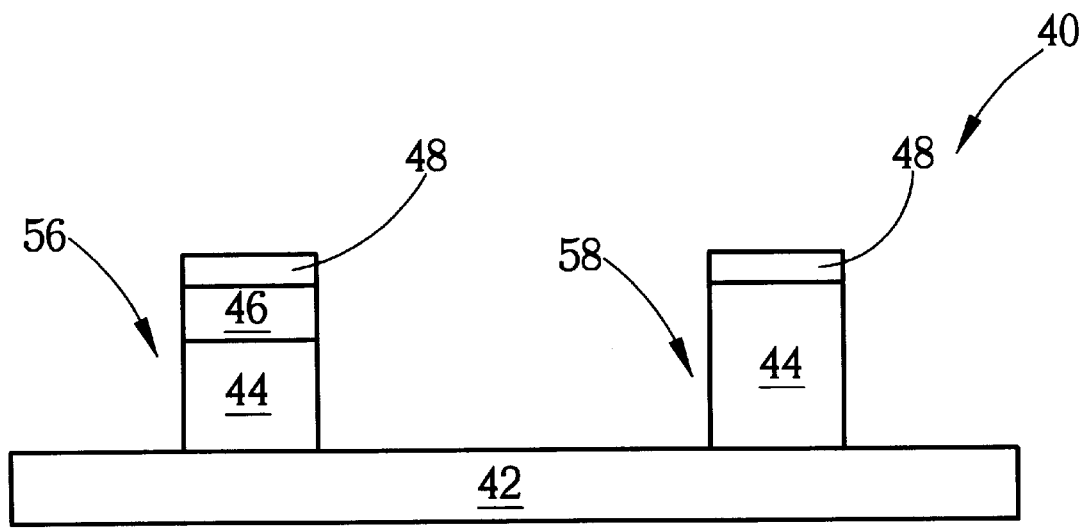

Afterward, a second dry-etching process is performed to vertically etch away the residual portion of the poly-silicon layer 44 not covered by the photo-resist layer 50 down to the surface of the dielectric layer 42, as shown in FIG. 7. The etching gases used in the second dry-etching process comprise $Cl_2$, HBr and $O_2$. This completes the etching of the poly-silicon layer 44. Finally, the photo-resist layers 50 are removed thus forming the anti-reflection bottom layer 48 and the poly-silicon layer 44 in the predetermined area as a plurality of gates 56, 58 with rectangular cross-sections, as shown in FIG. 8.

The etching gases used in the first dry-etching process differ from those used in the second dry-etching process. During the first dry-etching process, the ratio of $C_2H_6$ to other etching gases and the operating conditions of the chamber are controlled such that the etching rates on the sidewalls of the ion implantation layer 46 and the poly-silicon layer 44 without dopants is the same. This prevents the sidewalls of the ion implantation layer 46 from becoming over etched and sunken. During the second dry-etching process, the poly-silicon layer 44 without dopants can be etched away. Therefore, the sidewalls of both gates 56, 58 become vertical so that the reliability of semiconductor products is increased.

Under the scanning electron microscope (SEM), the sidewalls of the gates 56, 58 are seen to be vertical. Also, three standard deviations of the smallest gate length is less than 10 nm and the bias between the smallest gate length before and after etching are well controlled. This provides stability of the critical dimension of gate length.

Compared to the prior method of etching the poly-silicon layer 14, in the method of etching the poly-silicon layer 44 of the present invention, $C_2H_6$ is employed as the main etching gas during the first dry-etching process to etch away the ion implantation layer 46 and the poly-silicon layer 44. Next, the second dry-etching process is performed to etch away the residual poly-silicon layer 44 not covered by the photo-resist layer 50. Therefore, the sidewalls of the gates 56, 58 are vertical and the reliability of semiconductor products is enhanced.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method for etching a poly-silicon layer of a semiconductor wafer, the semiconductor wafer comprising a dielectric layer, a poly-silicon layer situated on the dielectric layer wherein portions of the poly-silicon layer containing dopants, and a photo-resist layer situated above the poly-silicon layer, the semiconductor wafer being processed in a plasma chamber, the method comprising:

performing a first dry-etching process to vertically etch away the dopant-containing portion of the poly-silicon layer not covered by the photo-resist layer wherein the power of the top-electrode and bottom-electrode of the plasma chamber is 200 to 300 W and 50 to 100 W, respectively; and performing a second dry-etching process to vertically etch away the residual portion of the poly-silicon layer not covered by the photo-resist layer down to the surface of the dielectric layer;

wherein the etching gases used in the first dry-etching process differ from those used in the second dry-etching process, and the main etching gas of the first dry-etching process is $C_2F_6$.

2. The method of claim 1 wherein the flow rate of $C_2F_6$ in the first dry-etching process is 70 to 150 sccm.

3. The method of claim 1 wherein the etching gases of the first dry-etching process also comprises helium (He) and oxygen (O).

4. The method of claim 1 wherein the chamber pressure of the first dry-etching process is 10 to 20 mTorr.

5. The method of claim 1 wherein the temperature of the chamber wall is 50 to 70° C. and the temperature of the electro-static chuck for loading the semiconductor wafer in the plasma chamber is 65 to 75° C.

6. The method of claim 1 wherein the etching gases of the second dry-etching process comprise chlorine (Cl), HBr and $O_2$.

* * * * *